United States Patent
Schubert et al.

(10) Patent No.: US 8,711,599 B2
(45) Date of Patent: Apr. 29, 2014

(54) POLARIZATION-COUPLED FERROELECTRIC UNIPOLAR JUNCTION MEMORY AND ENERGY STORAGE DEVICE

(75) Inventors: Mathias M. Schubert, Lincoln, NE (US); Tino Hofmann, Lincoln, NE (US); Venkata Rao Voora, Lincoln, NE (US)

(73) Assignee: NUtech Ventures, Lincoln, NE (US)

( * ) Notice: Subject to any disclaimer, the term of this patent is extended or adjusted under 35 U.S.C. 154(b) by 56 days.

(21) Appl. No.: 13/253,022

(22) Filed: Oct. 4, 2011

(65) Prior Publication Data
US 2012/0081943 A1 Apr. 5, 2012

Related U.S. Application Data

(60) Provisional application No. 61/389,403, filed on Oct. 4, 2010.

(51) Int. Cl.
*G11C 11/22* (2006.01)

(52) U.S. Cl.
USPC ........ 365/145; 365/49.13; 365/148; 365/149; 365/150; 365/189.011; 365/189.14; 365/189.07; 365/189.09

(58) Field of Classification Search
USPC .............. 365/49.13, 145, 148, 149, 150, 365/189.011, 189.14, 189.07, 189.09
See application file for complete search history.

(56) References Cited

U.S. PATENT DOCUMENTS

| 5,744,374 | A   | * | 4/1998  | Moon          | 438/3     |
|-----------|-----|---|---------|---------------|-----------|
| 8,089,110 | B1  | * | 1/2012  | Krieger       | 257/295   |
| 8,350,444 | B2  | * | 1/2013  | Erbil et al.  | 310/306   |
| 2008/0164237 | A1 | * | 7/2008 | Kawakubo et al. | 216/17 |
| 2008/0225569 | A1 | * | 9/2008 | Nawano        | 365/145   |
| 2010/0102289 | A1 | * | 4/2010 | Dimitrov et al. | 257/2   |
| 2010/0289004 | A1 | * | 11/2010 | Nakahara et al. | 257/15 |
| 2011/0315914 | A1 | * | 12/2011 | Chen et al.   | 252/62.55 |

OTHER PUBLICATIONS

Schubert, et al., "Electro-optical Properties of ZnO-BaTiO$_3$ZnO) Heterostructures Grown by Pulsed Laser Deposition", Ann. Phys. (Leipzig) 13, No. 1-2, 61-62, 2004.

* cited by examiner

*Primary Examiner* — Fernando Hidalgo
(74) *Attorney, Agent, or Firm* — Fish & Richardson P.C.

(57) ABSTRACT

A memory device is provided. The memory device includes a plurality of memory cells and a controller to write data to and read data from the memory cells. Each memory cell includes a first semiconductor material having a spontaneous polarization, a resistive ferroelectric material having a switchable spontaneous polarization, and a second semiconductor material having a spontaneous polarization, the resistive ferroelectric material being positioned between and in contact with the first and second semiconductor materials. The memory device can be configured to store energy that can be released by applying a voltage pulse to the memory device.

36 Claims, 11 Drawing Sheets

POLARIZATION-COUPLED FERROELECTRIC UNIPOLAR JUNCTION MEMORY AND ENERGY STORAGE DEVICE

CROSS-REFERENCE TO RELATED APPLICATIONS

This application claims priority to U.S. Provisional Application Ser. No. 61/389,403, filed on Oct. 4, 2010. The above application is incorporated herein by reference in its entirety.

TECHNICAL FIELD

This subject matter is generally related to polarization-coupled ferroelectric unipolar junction memory and energy storage device.

BACKGROUND

Non-volatile semiconductor memory devices are useful in many areas, such as consumer, defense, medical and life science instrumentation that needs fast response and low-power operations. For example, non-volatile semiconductor memory devices can be used in cell-phones, hand-held computers, game devices, control panels, and automotive controls. An example of a non-volatile semiconductor memory device is a flash memory device. In a flash memory device, each memory cell has a control gate and a floating gate, which is insulated all around by an oxide layer. The floating gate is interposed between the control gate and a channel. The floating gate is electrically isolated by its insulating layer and can trap electrons placed on it. The trapped electrons affect the threshold voltage of the device. During read-out, a voltage is applied to the control gate, and the channel will become conducting or remain insulating, depending on the threshold voltage of the cell, which is in turn controlled by the charge on the floating gate. The current flowing through the channel is sensed and forms a binary code, reproducing the stored data.

SUMMARY

In general, in one aspect, a memory device is provided. The memory device includes a plurality of memory cells and a controller to write data to and read data from the memory cells. Each memory cell includes a first semiconductor material having a spontaneous polarization, a resistive ferroelectric material having a switchable spontaneous polarization, and a second semiconductor material having a spontaneous polarization, the resistive ferroelectric material being positioned between and in contact with the first and second semiconductor materials.

Implementations of the memory device may include one or more of the following features. The controller can apply a voltage pulse of a first polarity to a memory cell to cause the memory cell to enter a first state, apply a voltage pulse of a second polarity to the memory cell to cause the memory cell to enter a second state, and the memory cell can have different resistances in the first and second states. The controller can apply a voltage pulse of a first polarity to a memory cell to cause the ferroelectric material in the memory cell to have a first polarization direction, and apply a voltage pulse of a second polarity to the memory cell to cause the ferroelectric material to have a second polarization direction. The ferroelectric material can have a thickness less than 5 microns, and the amplitude of the voltage pulse applied to change the polarization direction of the ferroelectric material can be less than 5 V. The controller can read data from a memory cell by applying a voltage to the memory cell and comparing a current flowing through the memory cell to a threshold value. The voltage level used to read data from a memory cell can be lower than the voltage level used to write data to the memory cell. The first and second semiconductor materials can include ZnO, GaN, AlN, or InN. The ferroelectric material can include barium titanate ($BaTiO_3$). Each memory cell can have exactly two terminals for receiving read or write signals from the controller, one of the two terminals contacting the first semiconductor material, the other of the two terminals contacting the second semiconductor material. The memory cells can be stacked in a three-dimensional array that includes layers of two-dimensional arrays of memory cells. The memory device can be configured to store energy that can be released by applying a voltage pulse to the memory device. The first semiconductor material can include a piezoelectric material. The first semiconductor material can have a wurtzite structure. The resistive ferroelectric material can have a perovskite structure.

In general, in another aspect, a memory device is provided. The memory device includes a plurality of memory cells and a controller to write data to and read data from the memory cells. Each memory cell includes a first material having a fixed spontaneous polarization, a second material having a switchable spontaneous polarization, and a third material having a fixed spontaneous polarization, the second material being positioned between and in contact with the first and third materials.

Implementations of the memory device may include one or more of the following features. The first material includes a semiconductor material. The second material includes a resistive ferroelectric material.

In general, in another aspect, a method of fabricating a memory device is provided. The method includes providing a plurality of memory cells on a substrate, and providing a controller for writing data to and reading data from the memory cells. Each memory cell includes a first semiconductor material having a spontaneous polarization, a resistive ferroelectric material having a switchable spontaneous polarization, and a second semiconductor material having a spontaneous polarization, the resistive ferroelectric material being positioned between and in contact with the first and second semiconductor materials.

Implementations of the memory device may include one or more of the following features. The method can include providing exactly two terminals for each of the memory cells for receiving read or write signals, one of the two terminals contacting the first semiconductor material of the memory cell, the other of the two terminals contacting the second semiconductor material of the memory cell. The method can include fabricating at least one of the first and second semiconductor materials using ZnO, GaN, AlN, or InN. The method can include fabricating the ferroelectric material using barium titanate ($BaTiO_3$).

In general, in another aspect, a method of using a memory device is provided. The memory device includes a plurality of memory cells, each memory cell including a first semiconductor material having a spontaneous polarization, a resistive ferroelectric material having a switchable spontaneous polarization, and a second semiconductor material having a spontaneous polarization, the resistive ferroelectric material being positioned between and in contact with the first and second semiconductor materials. The method includes writing first data to a memory cell by applying a first voltage pulse of a first polarity to the memory cell to cause the memory cell to enter a first state; writing second data to the memory cell by applying a second voltage pulse of a second polarity to the memory cell to cause the memory cell to enter a second state, the memory cell have different resistances when in the first and second states; and reading data from the memory cell by sensing current flowing through the memory cell to determine whether the memory cell is in the first state or the second state.

Implementations of the method may include one or more of the following features. Writing the first data to the memory cell can include causing the ferroelectric material in the memory cell to have a first polarity, and writing the second data to the memory cell can include causing the ferroelectric material in the memory cell to have a second polarity. The first voltage pulse can be larger than 2 volts, and reading data from the memory cell can include applying a voltage signal less than 2 volts to the memory cell.

In general, in another aspect, an energy storage device includes a plurality of energy storage cells, and a controller to store energy in a cell by applying a first voltage pulse to the cell and to release the energy from the cell by applying a second voltage pulse to the cell. Each energy storage cell includes a first semiconductor material having a spontaneous polarization, a resistive ferroelectric material having a switchable spontaneous polarization, and a second semiconductor material having a spontaneous polarization, the resistive ferroelectric material being positioned between and in contact with the first and second semiconductor materials.

Implementations of the energy storage device may include one or more of the following features. After energy is stored in a cell, the energy is not released from terminals of the cell until the second voltage pulse is applied to the cell. When the cell stores energy and the second voltage pulse is applied to the cell, the amount of energy released from the cell can be greater than the amount of energy applied to the cell by the second voltage pulse. The controller can apply a voltage pulse of a first polarity to an energy storage cell to cause the ferroelectric material in the energy storage cell to have a first polarity, and apply a voltage pulse of a second polarity to the energy storage cell to cause the ferroelectric material to have a second polarity. The first and second semiconductor materials can include ZnO, GaN, AlN, or InN. The ferroelectric material can include barium titanate ($BaTiO_3$). Each energy storage cell can have exactly two terminals for receiving signals, one of the two terminals contacting the first semiconductor material, the other of the two terminals contacting the second semiconductor material. The energy storage cells can be stacked in a three-dimensional array having layers of two-dimensional arrays of energy storage cells. The energy storage device can be configured as a memory device to store data, in which the controller applies a voltage pulse of a first polarity to a cell to cause the cell to enter a first state, the controller applies a voltage pulse of a second polarity to the cell to cause the cell to enter a second state, and the cell has different resistances in the first and second states. The first semiconductor material can include a piezoelectric material. The first semiconductor material can have a wurtzite structure. The resistive ferroelectric material can have a perovskite structure.

DETAILED DESCRIPTION

Figure 1:
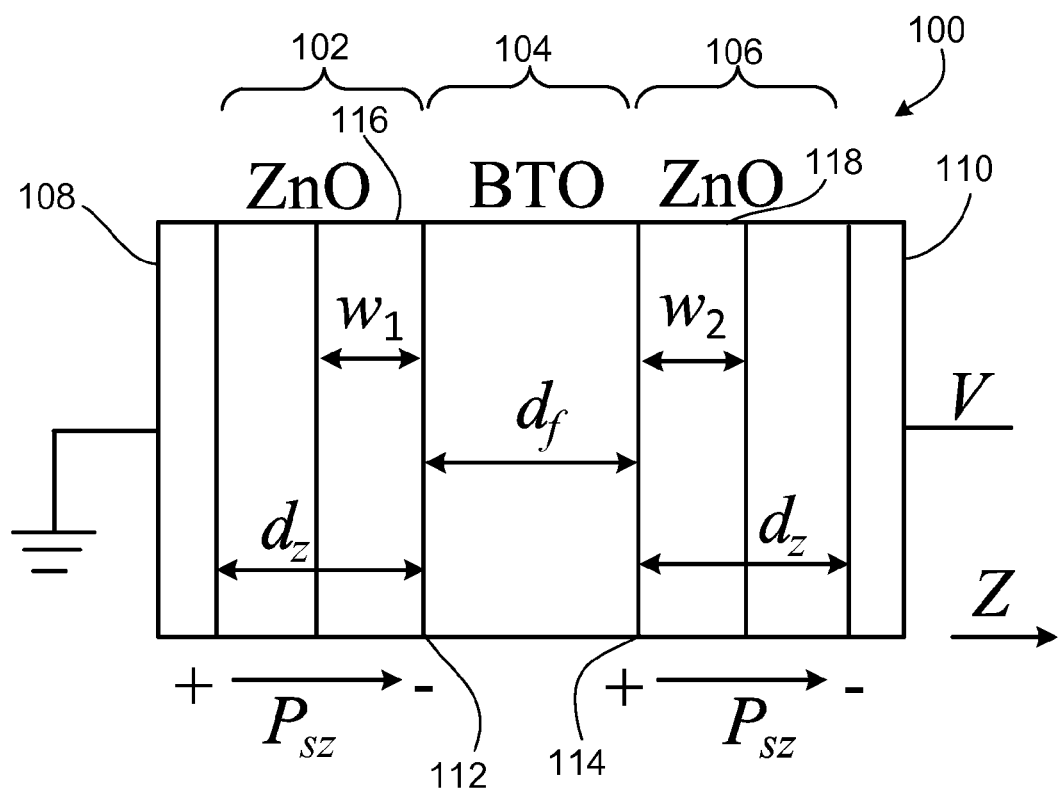
FIG. 1 is a side view diagram of a non-volatile memory cell.

Referring to FIG. 1, in some implementations, a non-volatile memory cell 100 includes a first layer 102 having a fixed spontaneous polarization $P_{sz}$, a second or middle layer 104 having a switchable spontaneous polarization, and a third layer 106 having a fixed spontaneous polarization $P_{sz}$. A first electrode 108 is coupled to the first layer 102, and a second electrode 110 is coupled to the third layer 106. A depletion layer 116 is formed near an interface 112 between the first and second layers 102, 104, and a depletion layer 118 is formed near an interface 114 between the second and third layers 104, 106. The direction of the polarization of the middle layer 104 affects the overall widths of the depletion layers 116, 118, which in turn affects the resistance of the memory cell 100 as measured between the first and second electrodes 108, 110. By switching the direction of polarity of the middle layer 104, the memory cell 100 can switch between two states having different resistances. For example, a higher resistance state can represent a logic one, and a lower resistance state can represent a logic zero.

In some examples, the first and third layers 102, 106 are made of a piezoelectric semiconductor material having a spontaneous polarization, such as zinc oxide (ZnO). The second layer 104 is made of a resistive ferroelectric material having a switchable spontaneous polarization, such as barium titanate ($BaTiO_3$ or BTO). Other materials can also be used. For example, the first and third layers 102, 106 can be made of GaN, AlN, or InN. The thickness $d_z$ of the first and third layers 102, 106 and the thickness $d_f$ of the middle layer 104 can be in the range of, e.g., a few nanometers to several microns.

Barium titanate belongs to a class of ferroelectric materials that can change the charge at some of its surfaces depending on history, the (crystallographic or structure-pertinent) surface orientation, and internal electric field. For such ferroelectric materials, certain constituent elements within their structure can be physically moved such that the resulting bond charges are distributed asymmetrically with respect to a certain axis within the material. As a result, the asymmetric bond charge distribution produces an electric charge equivalent at the surface perpendicular to the redistribution (ferroelectric) axis. Materials can possess different of such axes. Barium titanate in its perovskite structure is an example of a single-axis ferroelectric material. In BTO, the central titanium (Ti) atom in its oxygen-decorated octahedron can move within two stable positions that are asymmetric with respect to the octahedron center. As a result, perpendicular to the c-axis of the perovskite structure, a lattice charge is produced. This lattice charge can be inverted by applying an external potential to the two oppositely charged surfaces. The resulting internal electric field, once strong enough (the so called coercive field) switches the lattice dipole.

Materials and compositions that has the ability to form the above discussed lattice charge at certain surfaces are typically also piezoelectric. Piezoelectric materials shift their internal bond charges asymetrically upon applied external stress or strain. The results is a surface charge. Some materials and compositions possess such a charge even in equilibrium condition, i.e., without externally applied stress or strain. Examples of such a material class include the wurtzite structure ZnO, or GaN, AlN, InN compounds. ZnO is a semiconductor, which is typically n-type.

Both ferroelectric surface charge and the wurtzite structure piezoelectric surface charge are spontaneous, i.e., they exist without treatment or external physical influence. The difference between the two types of charges is that the piezoelectric spontaneous surface charge cannot be reversed, it is inherent to the lattice, which is fixed. The ferroelectric surface charge, on the other hand, can be reversed as discussed above.

A memory device can be implemented by using a three layer device, in which the first and third layers are composed of a semiconductor (n or p type) having lattice fixed interface charges, and the second or middle layer is composed of a resistive ferroelectric material having switchable interface charges.

Figure 9:
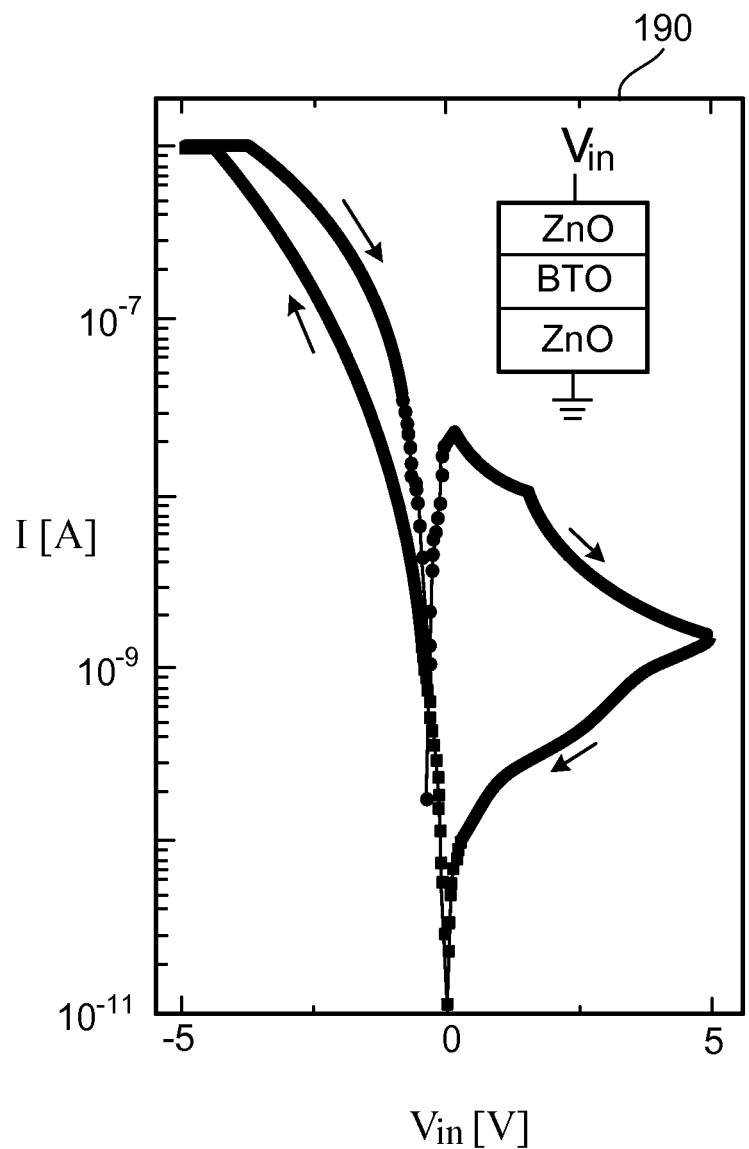
FIG. 9 is a graph showing the hysteresis characteristics of a ZnO—BTO—ZnO heterostructure device.

In the example of FIG. 1, ZnO is used as the semiconductor material having lattice fixed interface charges, and the BTO is used as the resistive ferroelectric material having switchable interface charges. The lattice-fixed interface charge polarizations (here due to the (0001) orientation of the ZnO layers) are oriented parallel with respect to each other and perpendicular to the interface. The interfaces between ZnO and BTO form barriers, i.e., they function as junctions. Because the ZnO layers are n-type, electron depletion space charge regions (SCR) $w_1$ (116) and $w_2$ (118) form. The side that has the negative lattice fixed charge has $w_1$, whereas no depletion layer $w_2$ forms initially on the opposite side of the BTO layer (the ZnO lattice charge here is positive attracting electrons from the bulk of the ZnO layer). Depending on the history and the bias voltage between the electrode 108 and the electrode 110, the middle layer 104 produces additional interface charges, which either increases $w_1$ or produces a smaller $w_2$ on the other side by destroying $w_1$. A symmetric reversal of the ferroelectric charges produces unequal charge differences on the two sides. The space charge region is proportional to the square of the applied potential difference (or equivalently the charge built in at the interface). The current from the layer 106 to the layer 102 depends on the potential barrier between the layers 104 and 102. This barrier is established by the amount of the built-in interface charge. The logarithm of the current is proportional to $$\frac{1}{kT}\left(\frac{P_{sz}d_z}{\varepsilon_z} \pm \frac{P_d d_f}{\varepsilon_f}\right)$$

where $P_{sz}$ ($P_d$), $d_z$, ($d_f$), $\varepsilon_z$ ($\varepsilon_f$) are the spontaneous lattice polarization, thickness and DC dielectric constants of the ZnO (ferroelectric) layer, respectively. For a given bias voltage V between the electrodes 110 and 108, the current flowing through the memory cell 100 is stable. The current changes with V in a non-linear manner similar to the current (I)-voltage $I_{CE}$ versus $V_{EC}$ characteristic of a bipolar junction transistor in the active or reverse active mode. FIG. 9 shows the log|I|–Vin (V) hysteresis characteristics of a ZnO—BTO—ZnO heterostructure. Vin refers to the voltage applied between the electrodes 110 and 108. In this measurement, the bias voltage Vin was cycled between +5 V DC and −5V DC. The current response is asymmetric with respect to measurements from negative to positive and from positive to negative voltages. The cause of the asymmetric behavior is the reversal of the orientation of the ferroelectric polarization at large negative and large positive voltages.

A complete reversal of the ferroelectric polarization produces a current switch proportional to $$\ln\frac{I_{CE}(+P_d)}{I_{CE}(-P_d)} = \frac{1}{kT}\frac{2P_d d_f}{\varepsilon_f}.$$

where $I_{CE}$ refers to the current flowing from the electrode 110 to the electrode 108.

In the example of FIG. 1, the piezoelectric semiconductor material in the first and third layers 102, 106 are configured such that the direction of the spontaneous polarization is aligned along the +z direction. In FIG. 1, the +z direction refers to the direction from the electrode 108 to the electrode 110. The polarization in the first and third layers 102, 106 can be represented by an electric dipole having a positive end and a negative end. When we say that the polarization direction is aligned along the +z direction, we mean that the direction from the positive end to the negative end of the dipole is in the +z direction.

In some examples, the electrode 108 is connected to ground, and the electrode 110 is configured to receive a voltage signal. The direction of the spontaneous polarization of the middle layer 104 can be aligned with an external electric field having a magnitude above a threshold. The external electric field can be provided by applying a voltage to the electrode 110. When the amplitude of the applied voltage is below a threshold, the polarization direction of the middle layer 104 does not change, regardless of the polarity of the applied voltage. When the applied voltage is above the threshold, the polarization direction of the middle layer 104 either remains the same, or switches to the opposite direction, depending on the polarity of the applied voltage and the current direction of the polarization.

Figure 2A:
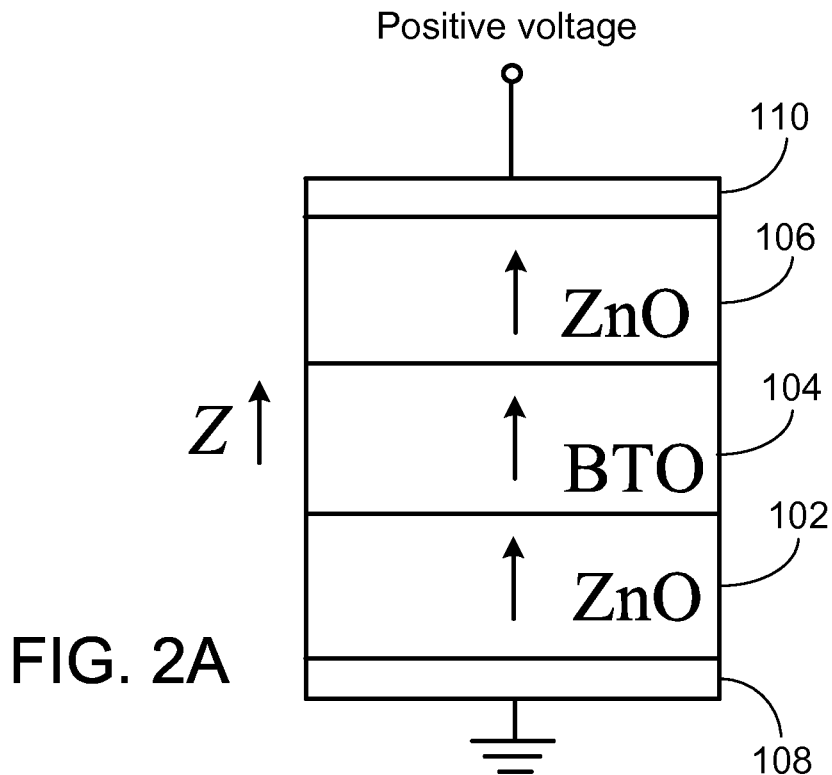
FIGS. 2A and 2B are diagrams showing polarization directions of layers in the memory cell.

Referring to FIG. 2A, when a positive bias voltage having an amplitude above a threshold is applied to the electrode 110, the polarization direction of the middle layer 104 will be aligned along the +z direction. In this example, the polarization direction of the middle layer 104 is the same as the polarization direction of the first and third layers 102, 106. This will cause the overall widths of the depletion layers 116 and 118 to be smaller (compared to the situation shown in FIG. 2B, described below).

Figure 2B:
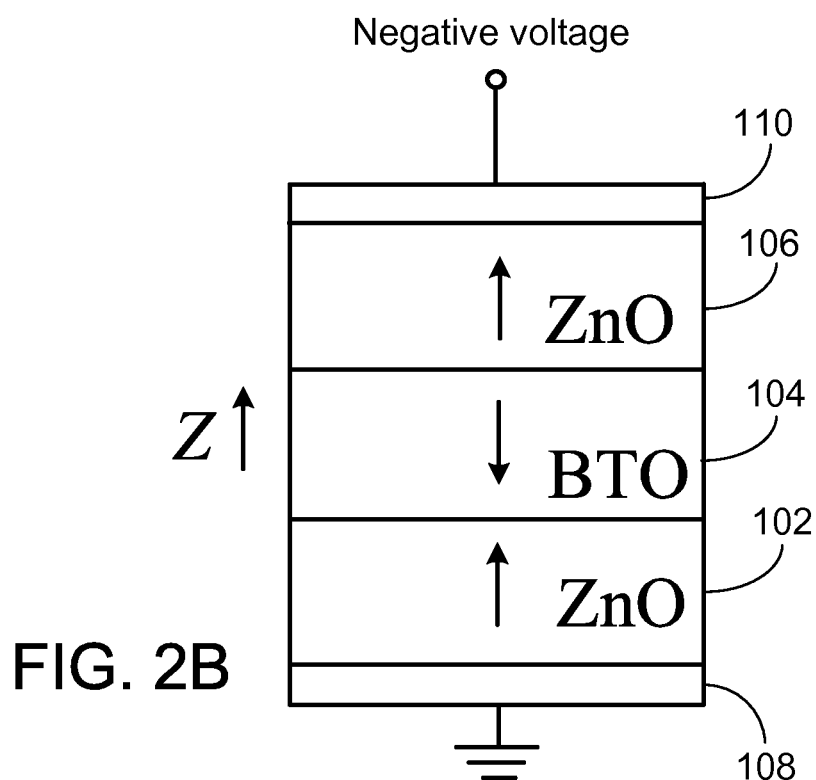

Referring to FIG. 2B, when a negative bias voltage having an amplitude above a threshold is applied to the electrode 110, the polarization direction of the middle layer 104 will be aligned along the −z direction. In this example, the polarization direction of the middle layer 104 is opposite to the polarization direction of the first and third layers 102, 106. This will cause the overall widths of the depletion layers 116, 118 to be larger (compared to the situation shown in FIG. 2A described above).

The threshold voltage for enabling the change in the polarization direction depends on the thickness of the layers 102, 104, and 106. When thicker layers 102, 104, and 106 are used, the threshold voltage is higher, and a higher bias voltage amplitude is needed to change the polarization direction of the ferroelectric material in the layer 104. Conversely, when thinner layers 102, 104, and 106 are used, the threshold voltage becomes lower, and a lower bias voltage amplitude is needed to change the polarization direction of the ferroelectric material in the layer 104. Thus, by using thinner layers, it is possible to implement a low-voltage non-volatile memory device.

For example, when the ferroelectric material layer has a thickness of about 1000 nm, the positive bias voltage has to be larger than about 3 V to change the polarization direction from the −z direction to the +z direction. When the ferroelectric material layer has a thickness of about 10 nm, the positive bias voltage has to be larger than about 0.15 V to change the polarization direction from the −z direction to the +z direction.

When writing data into the memory cell, the bias voltage can be applied in the form of voltage pulses. The duration of the pulses depends on the type of ferroelectric material used, and the thickness of the material.

A memory cell having the configuration shown in FIG. 1 was fabricated, and measurements were performed on the memory cell. The thickness for the ZnO layer was 0.5 micrometer, and the thickness for the BTO layer was 1 micrometer. The layers of materials were formed using vapor deposition.

Figure 3:
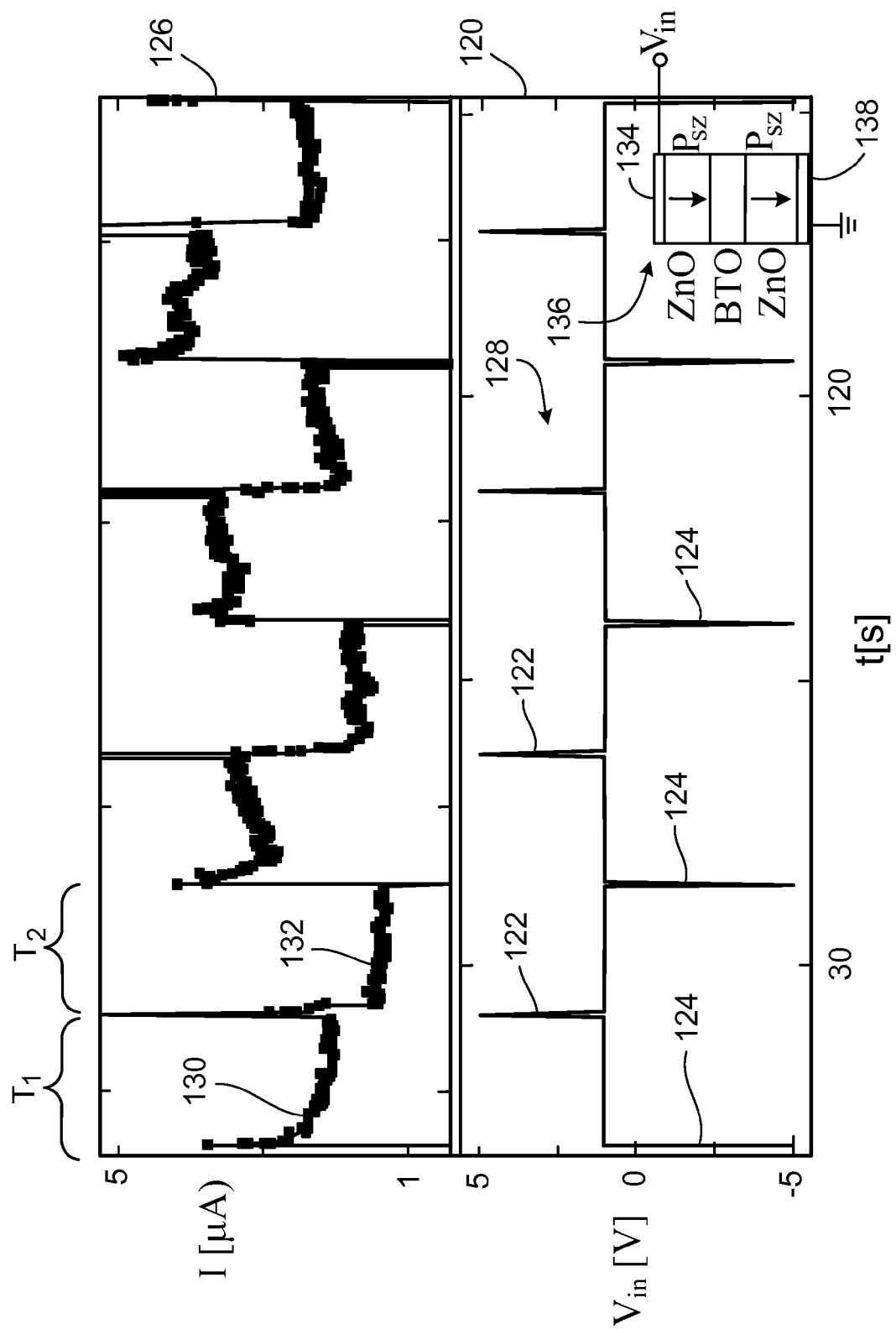
FIG. 3 shows graphs indicating the relationship between a voltage signal applied to the memory cell and the resulting current flowing through the memory cell.

Referring to FIG. 3, a graph 120 shows a voltage signal 128 applied to a top electrode 134 of a memory cell 136. A bottom electrode 138 of the memory cell 136 was connected to ground. The voltage signal 128 includes positive voltage pulses 122 and negative voltage pulses 124. In this example, the positive voltage pulses 122 are +5V pulses, and the negative voltage pulses 124 are −5V pulses. Each pulse has a duration of about 1 second. The voltage signal 128 is maintained at 1V in between the pulses.

A graph 126 shows the current flowing through the memory cell 100. A negative pulse 124 is applied at the start of a time period T1. During the time period T1, the current 130 has a relatively higher value, indicating that the memory cell 100 has a relatively lower resistance. A positive pulse 122 is applied to the memory cell 100 at the start of a time period T2. During the time period T2, the current 132 changes to a relatively lower value, indicating that the memory cell 100 changed to a relatively higher resistance. The graphs 120 and 126 demonstrate that data can be written into the memory cell 100 by applying positive or negative voltage pulses (e.g., +5V or −5V pulses). The data can be read from the memory cell 100 by applying a low voltage (e.g., 1V) signal and detecting the current flowing through the memory cell 100.

The +5V and −5V values are used for the particular memory cell that was tested. If different thicknesses are used for the layers 102, 104, and 106, the amplitudes of the applied voltage pulses for writing data and the applied voltage for reading data may be different from those shown in FIG. 3.

The memory cell 100 is non-volatile because once the polarization direction of the middle layer 104 is set, it does not change unless another voltage pulse having an amplitude sufficiently large to re-align the polarization direction is applied to the memory cell 100. Such non-volatile memory can be used in applications where flash memory devices are currently used.

Figure 4:
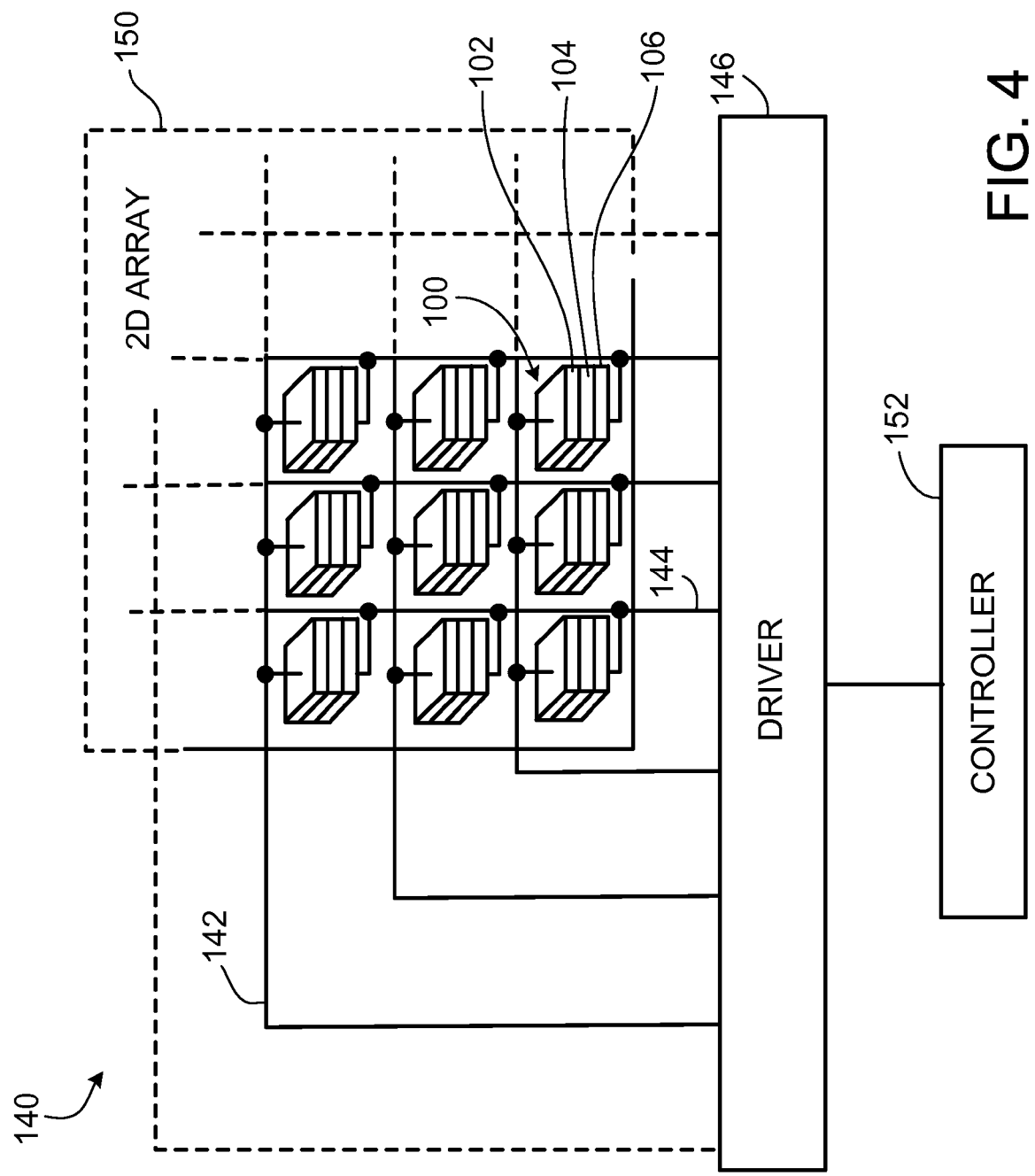
FIG. 4 is a diagram of a memory device having a two-dimensional array of memory cells.

Referring to FIG. 4, in some examples, a memory device 140 includes a two-dimensional array 150 of rows and columns of memory cells 100. Each memory cell 100 has a first layer 102, a second or middle layer 104, and a third layer 106, similar to the configuration shown in FIG. 1. Row lines 142 are provided in which each row line 142 is coupled to the first layer 102 of the memory cells 100 of a row. Column lines 144 are provided in which each column line 144 is coupled to the third layer 106 of the memory cells 100 of a column. The row lines 142 and the column lines 144 are driven by a driver 146. A controller 152 controls the driver 146 to generate appropriate write voltage signals for writing data to the memory cells 100, and to generate appropriate read voltage signals and to sense current levels for reading data from the memory cells 100.

To write to a particular memory cell 100 at the intersection of a row line 142 and a column line 144, the driver 146 controls the row line 142 and the column line 144 such that the voltage applied across the memory cell 100 is above the threshold for changing the polarization direction of the ferroelectric material layer 104. The other row lines and column lines are set to a high impedance state so as to not affect the memory cells connected to the other row lines and column lines.

Figure 5:
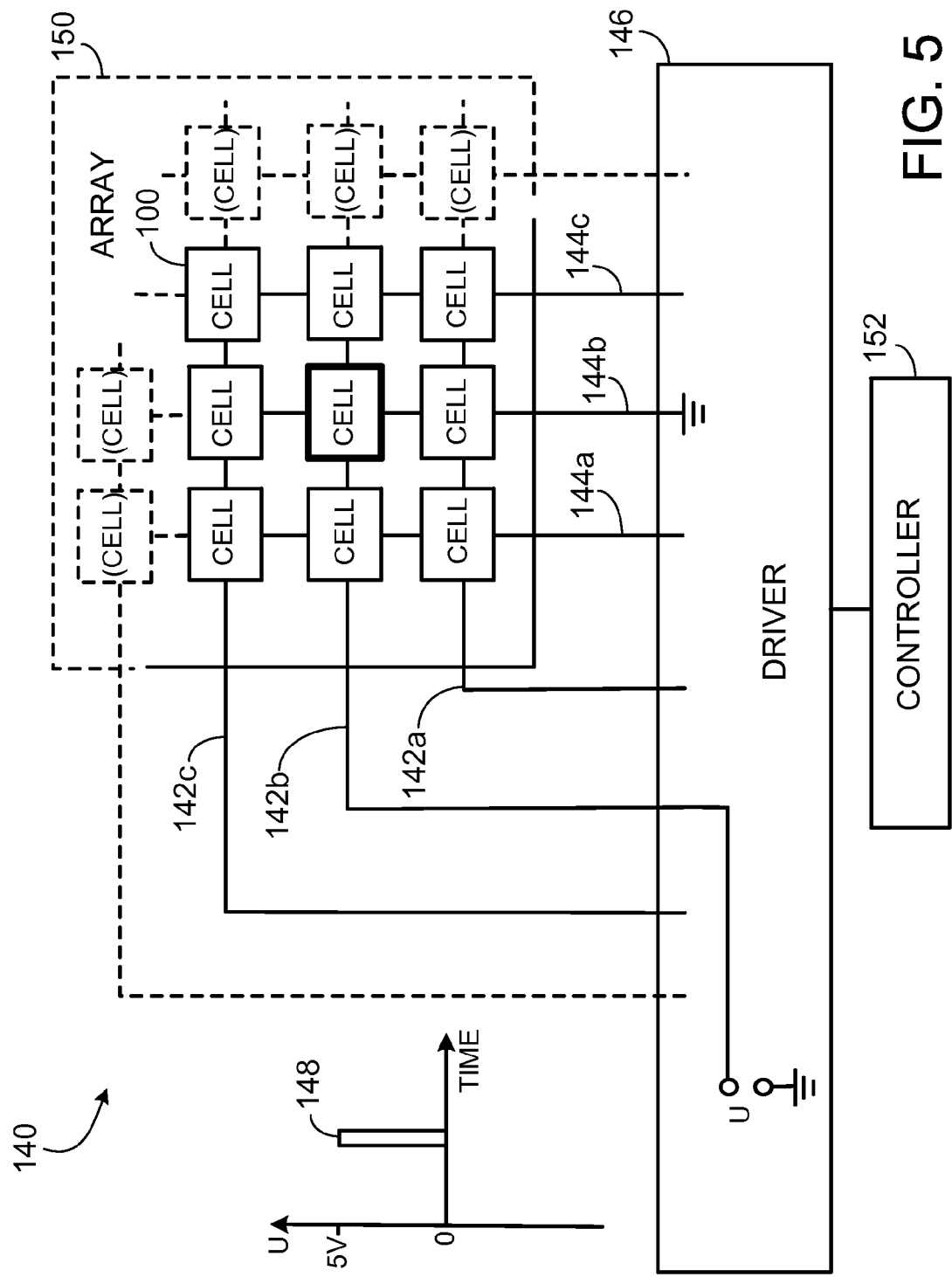
FIGS. 5 and 6 are diagrams of the memory device and signals for writing data to a memory cell.

For example, referring to FIG. 5, suppose the row lines include row lines 142a, 142b, 142c, . . . , the column lines include column lines 144a, 144b, 144c, . . . , and the memory cells 100 include memory cells 100aa, 100ab, 100ac, 100ba, 100bb, 100bc, 100ca, 100cb, 100cc, . . . , in which the memory cell 100xy is located at the intersection of row x and column y. For example, in order to write a logic 1 to the memory cell 100bb, the column line 144b is set to 0V, a 5V pulse voltage signal 148 is applied to the row line 142b, and the other row lines and column lines are set to high impedance so that the other memory cells are not affected.

Figure 6:
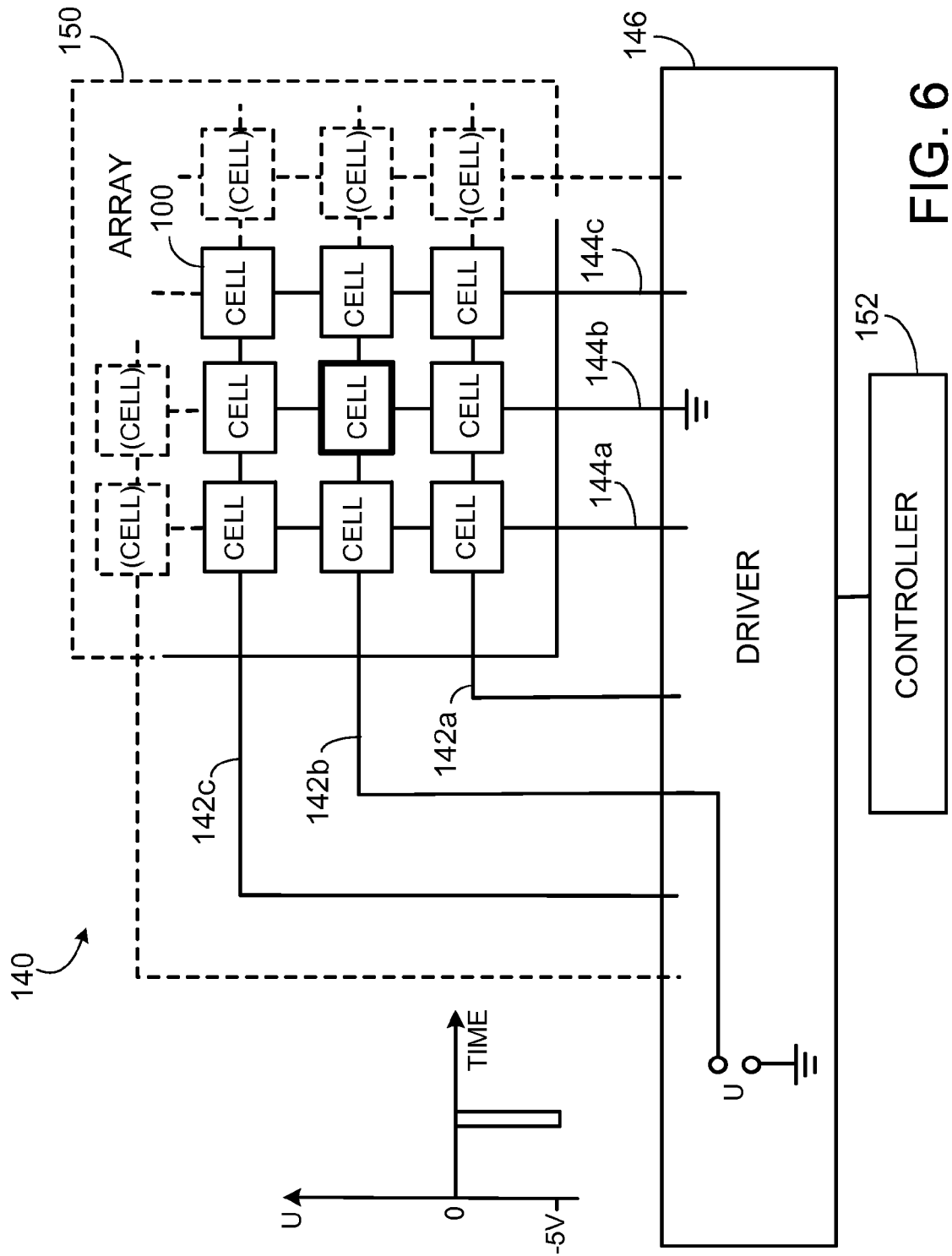

For example, referring to FIG. 6, in order to write a logic 0 to the memory cell 100bb, the column line 144b is set to 0V, a −5V pulse voltage signal is applied to the row line 142b, and the other row lines and column lines are set to high impedance.

Data can be written to several memory cells in parallel. For example, the column line 144a can be set to 0 V (with the other row lines set to high impedance), and a 5V or −5V pulse voltage signal can be applied to the row lines, depending on whether a logic 1 or a logic 0 needs to be written into the corresponding memory cell. This way, data are written into the memory cells connected to the column line 144a in parallel.

In order to read data from a particular memory cell at the intersection between a row line and a column line, a low voltage is applied between the row line and the column line, with the other row lines held at a high impedance, and the current flowing through the column line is measured and compared to a threshold. If the current is above the threshold, it is determined that a logic 1 is read from the memory cell. If the current is below the threshold, it is determined that a logic 0 is read from the memory cell.

Figure 7:
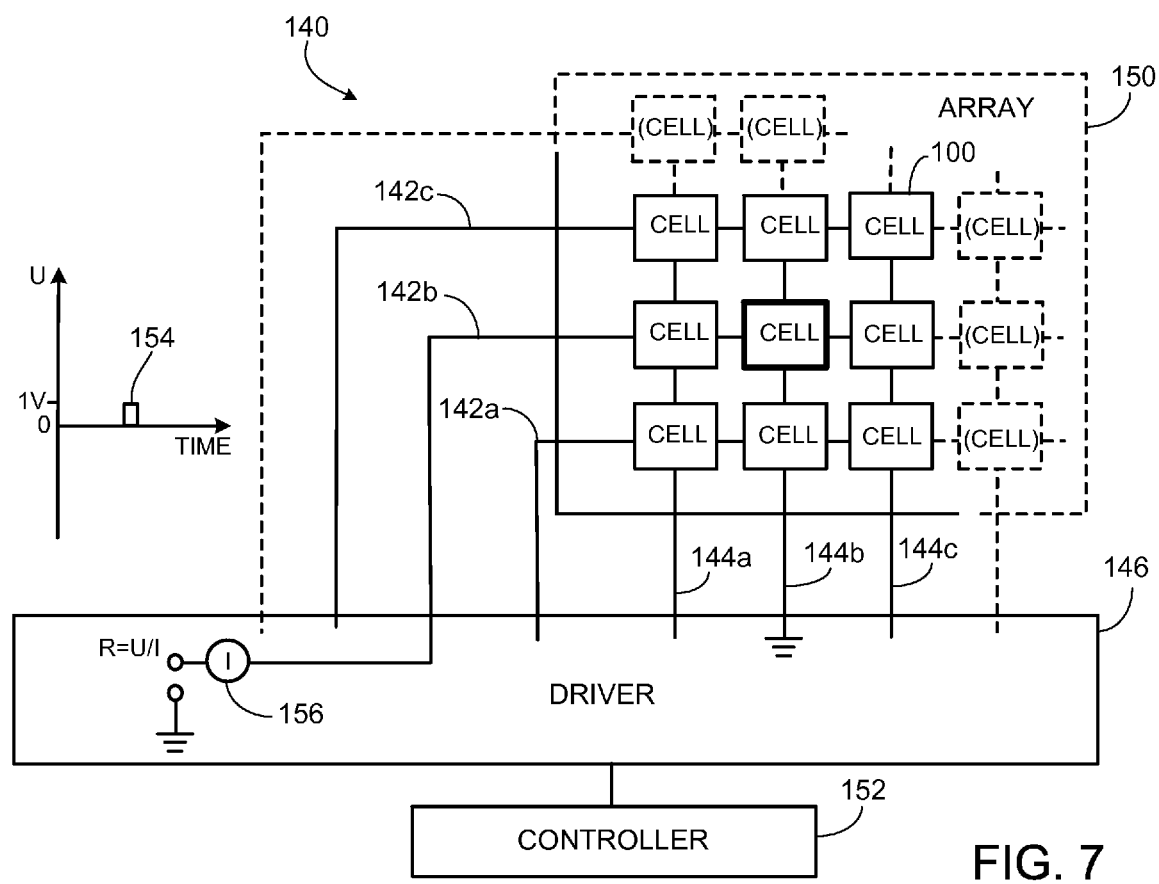
FIG. 7 is a diagram of the memory device and a signal for reading data from a memory cell.

For example, referring to FIG. 7, in order to read data from the memory cell 100bb at the intersection between the row line 142b and he column line 144b, the column line 144b is set to 0V, and a low voltage (e.g., 1V) pulse signal 154 is applied to the row line 142b, with the other row and column lines held at a high impedance. The current I flowing through the row line 142b is measured by using a current sensor 156 and compared to a threshold. If the current I is above the threshold, it is determined that a logic 1 is read from the memory cell 100bb. If the current I is below the threshold, it is determined that a logic 0 is read from the memory cell 100bb.

Multiple memory cells can be read at the same time. For example, a column line 144a can be held at 0V while the other column lines are held at high impedance, and a 1V pulse voltage signal is applied to all the row lines. The current flowing through each row line is measured to determine the data stored in each of the memory cells connected to the column line 144a.

Alternatively, a 1V pulse voltage signal can be applied to the row line 142a with all the other column lines held at high impedance, and a 0V voltage signal is applied to all the column lines. The current flowing through each column line is measured to determine the data stored in each of the memory cells connected to the row line 142a.

Addressing schemes other than those described above can also be used.

A feature of the memory cell 100 is that it only needs two terminals (electrodes 108 and 110) to operate. This allows the memory cells 100 to be stacked vertically in a three-dimensional array.

Figure 8:
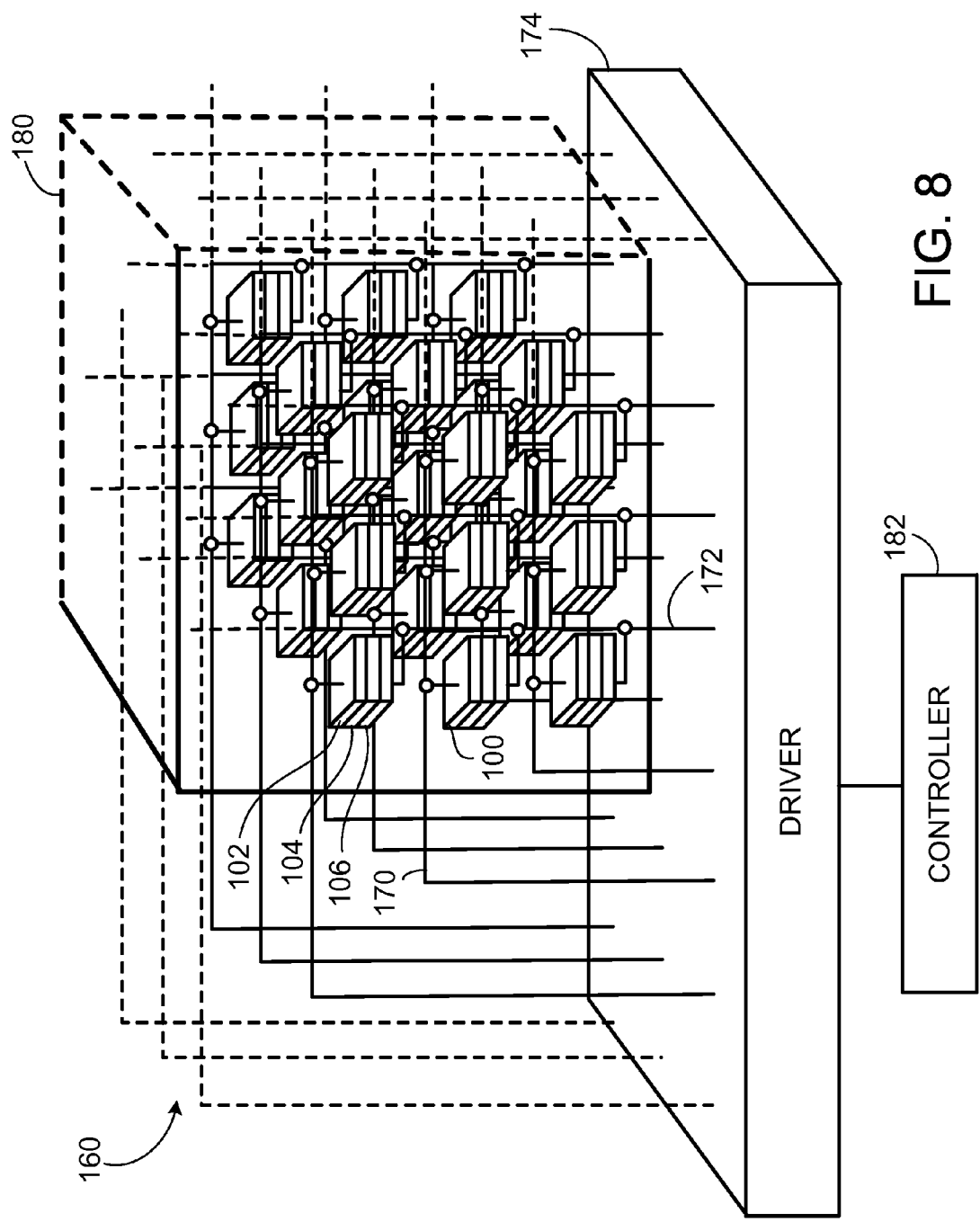
FIG. 8 is a diagram of a memory device having a three-dimensional array of memory cells.

Referring to FIG. 8, a memory device 160 includes a three-dimensional array 180 of layers of two-dimensional arrays of memory cells 100. Each two-dimensional array includes rows and columns of memory cells 100. Each memory cell 100 includes layers 102, 104, and 106 similar to those shown in FIG. 1. The memory device 160 includes a first set of signal lines 170 that are connected to the top electrodes of the memory cells 100, and a second set of signal lines 172 that are connected to the bottom electrodes of the memory cells 100.

A controller 182 controls a driver 174 to generate appropriate write voltage signals for writing data to the memory cells 100, and to generate appropriate read voltage signals and to sense current levels for reading data from the memory cells 100. Data can be written into and read from the memory cells 100 of the memory device 160 in a manner similar to those for the memory device 140. For example, to write a logic 1 to a particular memory cell, the bottom electrode of the memory cell is set at 0V, and a 5V pulse signal is applied to the top electrode of the memory cell 100. To write a logic 0 to a particular memory cell 100, the bottom electrode of the memory cell 100 is set at 0V, and a −5V pulse signal is applied to the top electrode of the memory cell 100.

Data can be written to several memory cells 100 in the three-dimensional memory array 180 in parallel, similar to the way that data can be written to several memory cells 100 in the two-dimensional memory array 150 in parallel.

In order to read data from a particular memory cell 100, a low voltage is applied between the top and bottom electrodes of the memory cell 100, and the current flowing through the memory cell 100 is measured and compared to a threshold. If the current is above the threshold, it is determined that a logic 1 is read from the memory cell 100. If the current is below the threshold, it is determined that a logic 0 is read from the memory cell 100.

Multiple memory cells 100 in the 3D array 180 can be read at the same time, similar to the way that multiple memory cells 100 in the 2D array 150 can be read at the same time.

Addressing schemes other than those described above can also be used.

When the ZnO and BTO layers are made thin, the voltage levels required to write data to and read data from the memory cells are low, so the power needed to perform read and write operations is also low. Because only a small amount of heat is generated from the read and write processes, the memory cells can be stacked densely in a three dimensional array, resulting in a high memory capacity for a given volume.

FIG. 9 is a graph 190 showing the current-voltage relationship of a memory cell 100. The memory cell 100 has an asymmetric hysteresis behavior, in which the current through the memory cell depends not only on the applied voltage, but also on the current state of the device.

The memory cell 100 of FIG. 1 can also be used to store energy by employing the two asymmetric configurations with the ferroelectric polarization aligned either parallel or anti-parallel to the lattice fixed charges. To begin with, the lowest energetic position for the ferroelectric dipole is parallel to the lattice fixed charge. Upon application of negative external bias voltage, the junction 112 between the first and second layers 102, 104 returns to forward direction (electrons accumulate and push the ferroelectric negative lattice charge into the junction 114 between the second and third layers 104, 106, thereby binding the equivalent charge amount of electrons by the now appearing positive side of the ferroelectric dipole at the junction 116). If the bias voltage is removed, the charges bound by the ferroelectric dipole cannot flow out of the terminals unless a small amount of negative charge is added to the electrode 110 to overcome the small potential barrier in which the antiparallel orientation of the dipole has formed.

Thus, after energy is stored in the memory cell 100, the energy remains stored in the memory cell 100, even if the electrodes 108 and 110 is connected to a load or short circuited. This is different from a traditional rechargeable battery, such as a lead acid battery, nickel-metal hydride battery, nickel-zinc battery, or lithium-ion battery. In a traditional rechargeable battery, the energy stored in the battery readily flows out of the battery when the battery is connected to load or is short-circuited. When the memory cell 100 functions as an energy storage device, a small negative bias voltage is applied to the electrode 110, upon which the memory cell 100 releases the stored energy such that a positive voltage having an amplitude higher than that of the applied voltage appears on the electrode 110. The released energy can then be used to power other devices.

Figure 10:
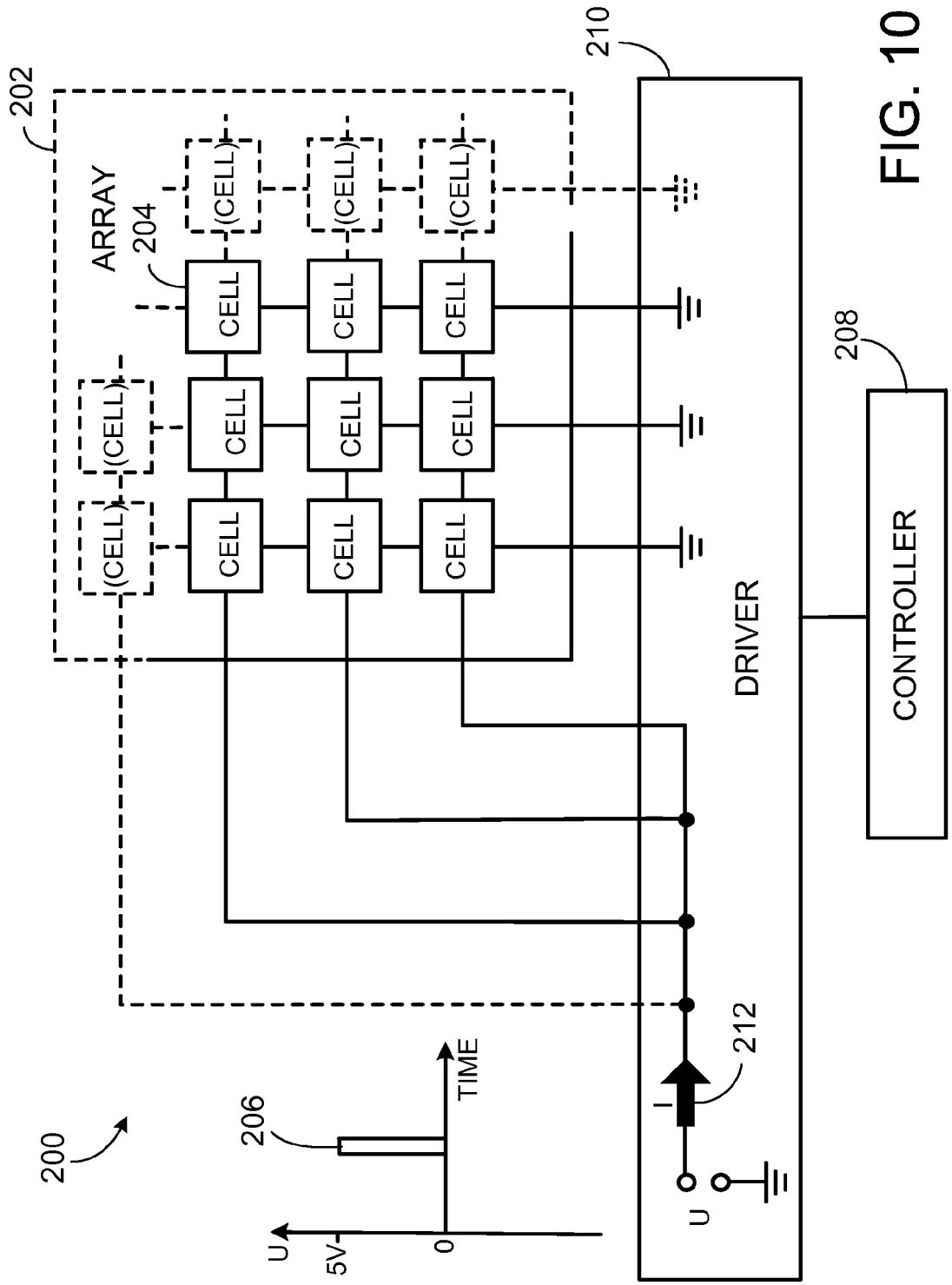
FIG. 10 is a diagram of an energy storage device having a two-dimensional array of energy storage cells and a signal for storing energy into the cells.

Referring to FIG. 10, an energy storage device 200 includes an array 202 of energy storage cells 204 that are used to store energy. Each energy storage cell 204 can have the same configuration as the memory cell 100. For example, each energy storage cell 204 can include a first layer having a fixed spontaneous polarization, a second or middle layer having a switchable spontaneous polarization, and a third layer having a fixed spontaneous polarization. A controller 208 controls a driver 210 to generate appropriate voltage signals for storing energy in the energy storage cells 204, and to generate appropriate voltage signals to release the stored energy from the cells 204. To store energy into the cells 204, the bottom electrodes of the cells 204 are connected to 0V, and a positive bias voltage pulse (e.g., 5V) 206 is applied to the top electrodes of the cells 204. A current I 212 flows from the voltage source to the cells 204. When the positive bias voltage 106 is removed, energy is stored in the cells 204 in the form of charges bound by the ferroelectric dipoles.

Figure 11:
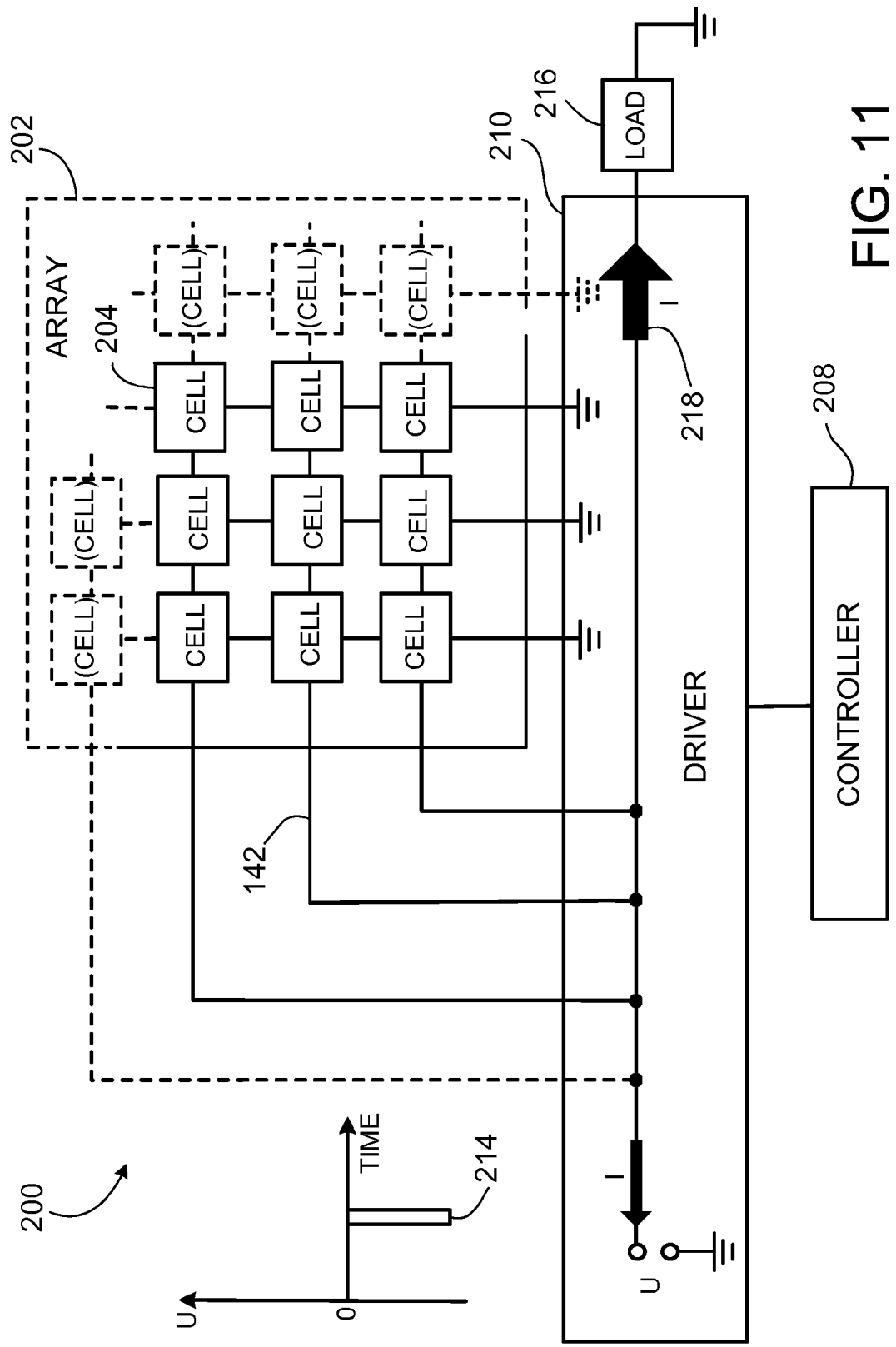
FIG. 11 is a diagram of the energy storage device and a signal for releasing stored energy from the cells.

Referring to FIG. 11, to retrieve stored energy from the cells 204, a negative bias voltage pulse signal 214 is applied to the top electrodes of the cells 204, after which a current 218 flows from the cells 204 to a load 216, which can be an electronic device to be powered by the cells 204.

In the example of FIG. 11, the stored energy from all of the cells 204 are released at the same time. By controlling the driver signals applied to the top and bottom electrodes of the cells 204, it is also possible to release energy from successive rows of cells, one row after another row (or successive columns of cells, one column after another), so that the stored energy in the array 202 is released over a period of time. In some examples, the controller 208 has information on the amount of energy required for a particular load, and controls the driver 210 to send appropriate signals so that energy is released from a selected number of cells 204. This way, the controller 208 can precisely control both the timing and the amount of energy that is provided to the load 216.

In an electronic device that uses a conventional rechargeable battery, a switch is positioned between the battery and the electronic circuits being powered by the battery. The switch controls whether the energy in the battery is provided to the electronic circuits. For a battery that uses the cells 204 to store energy, it is not necessary to place a switch between the battery and the electronic circuit. The battery will not release the stored energy unless a small bias voltage is applied to the battery.

Although the amount of energy stored in each individual cell 204 may be small, the memory cells 204 can be packed densely in a three-dimensional array, so the amount of energy stored for a given volume is still useful for powering electronic devices that consumes little power. The ferroelectric material in the middle layer of the cell 204 does not wear out after the polarization direction is changed many times, so the cell 204 can be recharged many times without degradation in performance.

In some examples, a memory device, such as 140 or 160, also functions as an energy storage device. In some examples, all of the cells function as both data storage cells and energy storage cells. In some examples, some of the cells function as data storage cells, and some of the cells function as energy storage cells. The same array of cells can be configured differently depending on application. For example, a program can be written into some of the cells, and energy can be stored in the remaining cells. The program may control how the stored energy is released over a period of time. The stored energy may also function as backup energy that is used when a primary power supply fails.

Although some examples have been discussed above, other implementations and applications are also within the scope of the following claims. For example, different materials can be used for the layers 102, 104, and 106. The dimensions of the layers 102, 104, and 106 can be different from those described above. The voltage levels for writing data to and reading data from the memory cells can be different from those described above. The layout of the memory cells in the two-dimensional array and the three-dimensional array can be different from those described above. The addressing schemes for controlling the row lines and column lines for writing data to and reading data from the memory cells can be different from those described above. The drivers 146 and 148 can be integrated with the controller 152. The drivers 174 and 176 can be integrated with the controller 182. The memory cells 100 can be integrated with other electronic circuits. A device having memory cells 100 can be used either as a data storage device, an energy storage device, or both. For example, a portion of the memory cells 100 can be used to store memory, while other memory cells 100 are used to store energy.

What is claimed is:

1. A memory device comprising:
   a plurality of memory cells, each memory cell comprising:
      a first semiconductor material having a spontaneous polarization,
      a resistive ferroelectric material having a switchable spontaneous polarization, and
      a second semiconductor material having a spontaneous polarization, the resistive ferroelectric material being positioned between and in contact with the first and second semiconductor materials; and
   a controller to write data to and read data from the memory cells, in which the controller is configured to apply a first write signal to one of the memory cells to set the spontaneous polarization of the resistive ferroelectric material to a first state to cause a combination of the first semiconductor material, the resistive ferroelectric material, and the second semiconductor material to have a first resistance, and apply a second write signal to the memory cell to set the spontaneous polarization of the resistive ferroelectric material to a second state to cause the combination of the first semiconductor material, the resistive ferroelectric material, and the second semiconductor material to have a second resistance, and the controller is configured to read data from the memory cell by detecting the resistance of the combination of the first semiconductor material, the resistive ferroelectric material, and the second semiconductor material.

2. The memory device of claim 1 in which the controller applies a voltage pulse of a first polarity to one of the memory cells to cause the memory cell to enter the first state, applies a voltage pulse of a second polarity to the memory cell to cause the memory cell to enter the second state, and the memory cell has different resistances in the first and second states.

3. The memory device of claim 1 in which the controller applies a voltage pulse of a first polarity to a memory cell to cause the ferroelectric material in the memory cell to have a first polarization direction, and applies a voltage pulse of a second polarity to the memory cell to cause the ferroelectric material to have a second polarization direction.

4. The memory device of claim 3 in which the ferroelectric material has a thickness less than 5 microns, and the amplitude of the voltage pulse applied to change the polarization direction of the ferroelectric material is less than 5 V.

5. The memory device of claim 1 in which the controller reads data from a memory cell by applying a voltage to the memory cell and comparing a current flowing through the memory cell to a threshold value.

6. The memory device of claim 5 in which the voltage level used to read data from a memory cell is lower than the voltage level used to write data to the memory cell.

7. The memory device of claim 1 in which the first and second semiconductor materials comprise at least one of ZnO, GaN, AlN, or InN.

8. The memory device of claim 1 in which the ferroelectric material comprises barium titanate ($BaTiO_3$).

9. The memory device of claim 1 in which each memory cell has exactly two terminals for receiving read or write signals, one of the two terminals contacting the first semiconductor material, the other of the two terminals contacting the second semiconductor material.

10. The memory device of claim 1 in which the memory cells are stacked in a three-dimensional array comprising layers of two-dimensional arrays of memory cells.

11. The memory device of claim 1 in which the memory device can be configured to store energy that can be released by applying a voltage pulse to the memory device.

12. The memory device of claim 1 in which the first semiconductor material comprises a piezoelectric material.

13. The memory device of claim 1 in which the first semiconductor material has a wurtzite structure.

14. The memory device of claim 1 in which the resistive ferroelectric material has a perovskite structure.

15. A memory device comprising:
   a plurality of memory cells, each memory cell comprising:
      a first material having a fixed spontaneous polarization,
      a second material having a switchable spontaneous polarization, and
      a third material having a fixed spontaneous polarization, the second material being positioned between and in contact with the first and third materials; and
   a controller to write data to and read data from the memory cells, in which the controller is configured to apply a first write signal to one of the memory cells to set the spontaneous polarization of the second material to a first state to cause a combination of the first material, the second material, and the third material to have a first resistance, and apply a second write signal to the memory cell to set the spontaneous polarization of the second material to a second state to cause the combination of the first material, the second material, and the third material to have a second resistance, and the controller is configured to read data from the memory cell by detecting the resistance of the combination of the first material, the second material, and the third material.

16. The memory device of claim 15 in which the first material comprises a semiconductor material.

17. The memory device of claim 15 in which the second material comprises a resistive ferroelectric material.

18. A method of fabricating a memory device, the method comprising:
providing a plurality of memory cells on a substrate, each memory cell comprising:
a first semiconductor material having a spontaneous polarization,
a resistive ferroelectric material having a switchable spontaneous polarization, and
a second semiconductor material having a spontaneous polarization, the resistive ferroelectric material being positioned between and in contact with the first and second semiconductor materials; and
providing a controller for writing data to and reading data from the memory cells, in which the controller is configured to apply a first write signal to one of the memory cells to set the spontaneous polarization of the resistive ferroelectric material to a first state to cause a combination of the first semiconductor material, the resistive ferroelectric material, and the second semiconductor material to have a first resistance, and apply a second write signal to the memory cell to set the spontaneous polarization of the resistive ferroelectric material to a second state to cause the combination of the first semiconductor material, the resistive ferroelectric material, and the second semiconductor material to have a second resistance, and the controller is configured to read data from the memory cell by detecting the resistance of the combination of the first semiconductor material, the resistive ferroelectric material, and the second semiconductor material.

19. The method of claim 18, comprising providing exactly two terminals for each of the memory cells for receiving read or write signals, one of the two terminals contacting the first semiconductor material of the memory cell, the other of the two terminals contacting the second semiconductor material of the memory cell.

20. The method of claim 18, comprising fabricating at least one of the first or second semiconductor material using at least one of ZnO, GaN, AlN, or InN.

21. The method of claim 18, comprising fabricating the ferroelectric material using barium titanate ($BaTiO_3$).

22. A method of using a memory device comprising a plurality of memory cells, each memory cell comprising a first semiconductor material having a spontaneous polarization, a resistive ferroelectric material having a switchable spontaneous polarization, and a second semiconductor material having a spontaneous polarization, the resistive ferroelectric material being positioned between and in contact with the first and second semiconductor materials, the method comprising:
writing first data to a memory cell by applying a first voltage pulse of a first polarity to the memory cell to cause the memory cell to enter a first state by setting the spontaneous polarization of the resistive ferroelectric material to a first state to cause a combination of the first semiconductor material, the resistive ferroelectric material, and the second semiconductor material to have a first resistance;
writing second data to the memory cell by applying a second voltage pulse of a second polarity to the memory cell to cause the memory cell to enter a second state by setting the spontaneous polarization of the resistive ferroelectric material to a second state to cause the combination of the first semiconductor material, the resistive ferroelectric material, and the second semiconductor material to have a second resistance; and
reading data from the memory cell by sensing current flowing through the memory cell to determine whether the memory cell is in the first state or the second state.

23. The method of claim 22 in which writing the first data to the memory cell comprises causing the ferroelectric material in the memory cell to have a first polarity, and writing the second data to the memory cell comprises causing the ferroelectric material in the memory cell to have a second polarity.

24. The method of claim 22 in which the first voltage pulse is larger than 2 volts, and reading data from the memory cell comprises applying a voltage signal less than 2 volts to the memory cell.

25. An energy storage device comprising:
a plurality of energy storage cells, each energy storage cell comprising
a first semiconductor material having a spontaneous polarization,
a resistive ferroelectric material having a switchable spontaneous polarization, and
a second semiconductor material having a spontaneous polarization, the resistive ferroelectric material being positioned between and in contact with the first and second semiconductor materials;
a controller to store energy in a combination of the first semiconductor material, the resistive ferroelectric material, and the second semiconductor material of a cell by applying a first voltage pulse to the cell and to release the energy from the combination of the first semiconductor material, the resistive ferroelectric material, and the second semiconductor material of the cell by applying a second voltage pulse to the cell; and
a path to allow the energy released from the combination of the first semiconductor material, the resistive ferroelectric material, and the second semiconductor material of the cell to be transmitted to a load coupled to the energy storage device.

26. The energy storage device of claim 25 in which after energy is stored in a cell, the energy is not released from terminals of the cell until the second voltage pulse is applied to the cell.

27. The energy storage device of claim 25 in which when the cell stores energy and the second voltage pulse is applied to the cell, the amount of energy released from the cell is greater than the amount of energy applied to the cell by the second voltage pulse.

28. The energy storage device of claim 25 in which the controller applies a voltage pulse of a first polarity to an energy storage cell to cause the ferroelectric material in the energy storage cell to have a first polarity, and applies a voltage pulse of a second polarity to the energy storage cell to cause the ferroelectric material to have a second polarity.

29. The energy storage device of claim 25 in which the first and second semiconductor materials comprise at least one of ZnO, GaN, AlN, or InN.

30. The energy storage device of claim 25 in which the ferroelectric material comprises barium titanate ($BaTiO_3$).

31. The energy storage device of claim 25 in which each energy storage cell has exactly two terminals for receiving signals, one of the two terminals contacting the first semiconductor material, the other of the two terminals contacting the second semiconductor material.

32. The energy storage device of claim 25 in which the energy storage cells are stacked in a three-dimensional array comprising layers of two-dimensional arrays of energy storage cells.

33. The energy storage device of claim 25 in which the energy storage device can be configured as a memory device to store data, the controller applies a voltage pulse of a first polarity to a cell to cause the cell to enter a first state, the controller applies a voltage pulse of a second polarity to the cell to cause the cell to enter a second state, and the cell has different resistances in the first and second states.

34. The energy storage device of claim 25 in which the first semiconductor material comprises a piezoelectric material.

35. The energy storage device of claim 25 in which the first semiconductor material has a wurtzite structure.

36. The energy storage device of claim 25 in which the resistive ferroelectric material has a perovskite structure.

\* \* \* \* \*